United States Patent
Fink et al.

(10) Patent No.: US 8,258,795 B2
(45) Date of Patent: Sep. 4, 2012

(54) PROCEDURE FOR CHECKING THE OPERATIONAL CAPABILITY OF AN ELECTRIC CIRCUIT

(75) Inventors: Hans-Jörg Fink, Freiburg (DE); Andreas Ring, Freiburg (DE)

(73) Assignee: Micronas GmbH, Freiburg I.Br. (DE)

( * ) Notice: Subject to any disclaimer, the term of this patent is extended or adjusted under 35 U.S.C. 154(b) by 382 days.

(21) Appl. No.: 12/689,080

(22) Filed: Jan. 18, 2010

(65) Prior Publication Data

US 2010/0188098 A1   Jul. 29, 2010

(30) Foreign Application Priority Data

Jan. 23, 2009  (EP) .................................... 09000937

(51) Int. Cl.
*G01R 31/02* (2006.01)
(52) U.S. Cl. ........................................ 324/537; 324/555
(58) Field of Classification Search .................. 324/500, 324/537, 555
See application file for complete search history.

(56) References Cited

U.S. PATENT DOCUMENTS

| 6,424,143 | B1 | 7/2002 | Blossfeld et al. |
| 2005/0243184 | A1 | 11/2005 | Fink |
| 2008/0162080 | A1 | 7/2008 | Brandt et al. |
| 2008/0224694 | A1 | 9/2008 | Bidenbach et al. |
| 2009/0295413 | A1 | 12/2009 | Borst |

FOREIGN PATENT DOCUMENTS

| DE | 10037495 A1 | 3/2002 |
| DE | 102007019183 A1 | 10/2007 |
| EP | 0962748 B1 | 12/1999 |
| EP | 1970720 A2 | 9/2008 |
| WO | 2006106111 A1 | 10/2006 |

OTHER PUBLICATIONS

Raab Ausfallinformation bei Digitalen Meβumformern mit analogem Ausgariges-signal: Vereinheitlichung des Signalpegels. ATP Automatisierungstechnische Praxis 36(1994) Juli, No. 7, pp. 30-32, 34-35, Munchen, DE (with English-language Abstract).

*Primary Examiner* — Vincent Q Nguyen
(74) *Attorney, Agent, or Firm* — Muncy, Geissler, Olds & Lowe, PLLC

(57) ABSTRACT

A procedure for checking the operational capability of an electric circuit, which has a sensor module and a diagnosis mechanism with the sensor module including an integrated switching circuit, wherein the sensor module has at least one output terminal connected to the diagnosis mechanism and power supply terminals, and wherein an operating voltage is applied via cables to the power supply terminals. The sensor module is switched to a test mode, in which a communication test signal is emitted from the output terminal. This signal is read in by the diagnostic mechanism and compared with a tolerance band range, in order to verify that the communication with the sensor module is operational. In the event of operational communication, the operational capability of the switching circuit is tested.

9 Claims, 2 Drawing Sheets

PROCEDURE FOR CHECKING THE OPERATIONAL CAPABILITY OF AN ELECTRIC CIRCUIT

BACKGROUND OF THE INVENTION

1. Field of the Invention

The invention relates to a procedure for checking the operational capability of an electric circuit that has at least one sensor module comprising an integrated switching circuit and a diagnostic mechanism allocated thereto, wherein the sensor module has at least one output terminal connected to the diagnostic mechanism and power supply terminals to which an operating voltage is applied via cables.

2. Description of the Related Art

Such a procedure is disclosed in EP 0 962 748 B1. In this procedure, the sensor module is configured as a monolithic integrated circuit, which has a sensor for measuring a magnetic field and a measurement amplifier. The sensor is connected via the measurement amplifier to an output terminal of the sensor module for emitting an output signal. Furthermore, the sensor module has two power supply terminals to which an operating voltage is applied via cables.

In addition to the measurement signal, circuit measurements available within the sensor module are emitted via the existing outer terminals. The circuit measurements are thus superimposed as modulation signals on the supply current, the supply voltage, and/or the output measurement signal as diagnostic signals. Either the internal circuit measurements are emitted as an analog or digital modulation and the output signal as a digital value, or the internal circuit measurement values are emitted as a digital modulation and the output measurement signal as an analog value. Connected to the output terminal is a controller module, which checks the circuit measurements in order to generate a message regarding the capacity and the functional status of the module based on these measurements. The procedure has proven to have particularly useful practical applications, as with said procedure it is possible to detect wear of the mechanical components operating in conjunction with the sensor module at an early stage so that appropriate measures, such as replacement of the worn components, can be taken in time to avoid a failure. However, a disadvantage resides in the procedure in that in the event of a defect in the electric circuit, it is difficult to determine whether the sensor module or the cables are damaged.

The object is therefore to design a procedure of the above-mentioned type that enables easy troubleshooting in the event of a defect in an electric circuit.

SUMMARY OF THE INVENTION

According to the invention, this object is achieved
wherein the sensor module is switched into a test mode, in which the sensor module emits a predefined communication test signal from the output terminal that differs from a constant signal level,
wherein the communication test signal is read in by the diagnostic mechanism and compared with a predefined tolerance band range in order to verify that the communication with the sensor module is operational,
wherein in the event of functional communication, the function of the integrated switching circuit is tested,
wherein the sensor module, in the event of a nonfunctional switching circuit
transmits an error signal to the diagnostic mechanism via the output terminal,
wherein the sensor module, in the event of a functional switching circuit
transmits a function signal dependent on a voltage residing at the power supply terminals and differing from the error signal to the diagnostic mechanism via the output terminal, and
wherein the function signal received by the diagnostic mechanism is compared with a predefined tolerance range and depending on the result of this comparison, the presence or the absence of a defect in the cable is confirmed.

Hence the communication between the sensor module and the diagnostic mechanism is checked first of all with the procedure. If this check confirms an error-free communication, the sensor module either sends the error signal or the function signal to the diagnostic mechanism as a status signal. Once the communication between the sensor module and the diagnostic mechanism has been confirmed, it is assumed that there are no errors with the transmission of the status signal.

In an advantageous manner, with the procedure it can be easily determined whether the sensor module or the cables is/are defective in the event of a defect in the electric circuit. Examples of possible defects in the cables include an excessively high contact resistance in an electric plug-in connector allocated to the cable or a cable break and/or mechanical damage to the cable. Once the defect is located with the help of the procedure, the electric circuit can be easily and inexpensively repaired by replacing the corresponding component, for example. If the electric circuit is integrated in a motor vehicle, the error can be temporarily stored, for example, in the diagnostic mechanism and then read out and displayed using a suitable reading device the next time the vehicle is taken to the shop. Obviously it is also possible, however, to have the error displayed on the dashboard or an on-board monitor of the vehicle, advising the operator of the vehicle to take it to a shop. With the procedure, the cables and the sensor module can also be easily checked for error-free operation.

In an advantageous embodiment of the invention, the amplitude of the function signal is proportional to the voltage residing at the power supply terminals, or to a component of this voltage. The procedure can then be easily used with a sensor module having a ratiometric output terminal.

The output terminal for emitting the error signal is advantageously set to a constant potential, particularly to ground potential. The procedure is then even more easily carried out.

In a preferred embodiment of the invention, the sensor module is switched between the test mode and an operating mode, wherein at least one measurement signal is captured and emitted via the output terminal in the operating mode. Hence the output terminal can also be used for emitting the measurement signal in addition to emitting the error or the function signal. The procedure can then even be used with sensor modules that have only three outer terminals, namely the output terminal and two power supply terminals.

The switching between the test mode and the operating mode can occur as a function of an external voltage, which is applied to the output terminal and/or as a function of an electric current, which is infed in the output terminal. This measure also enables the number of outer terminals of the sensor module to be reduced.

However, it is also possible to switch the sensor module to the test mode by applying the operating voltage to the power supply terminals. The procedure is then automatically carried out when the sensor module is booted up.

In an advantageous embodiment of the invention, the communication test signal has at least one ramp-shaped, stair-shaped, trapezoidal, and/or sawtooth signal section. It is then easy to carry out the procedure with sensor modules in which the output terminal is controlled via a digital-analog convertor. The communication test signal thus preferably runs through the entire control range of the digital-analog convertor, so that the operational capability of the digital-analog convertor is also checked while checking the communication path between the sensor module and the diagnostic mechanism.

In an improvement of the invention, different communication test signals are allocated to at least two sensor modules, wherein a number of different tolerance band ranges is stored that corresponds to the number of different communication test signals, which in each case are allocated to a communication test signal, wherein at least one sensor module is switched to the test mode and transmits its allocated communication test signal to the diagnostic mechanism, wherein the communication test signal received by the diagnostic mechanism is compared with the different tolerance band ranges, and wherein the sensor module that emitted the communication test signal is identified based on the result of these comparisons. In this manner it can be easily determined, for example, whether two or more sensor modules of a motor vehicle were accidentally switched or installed in the wrong place, for example, during a repair.

Preference is given to the integrated switching circuit having at least one Hall plate with at least one measurement current input and at least one Hall voltage output, which is connected via a signal processing stage to the output terminal of the sensor module, and wherein for generating the communication test signal, a test signal is applied to the measurement current input and/or to the Hall voltage output of the Hall plate and conducted via the signal processing stage to the output terminal. By means of the procedure, the entire signal path between the Hall plate and the diagnostic mechanism and if needed, even the Hall plate itself, can be tested for operational capability.

BRIEF DESCRIPTION OF THE DRAWINGS

An illustrative embodiment of the invention is explained in more detail in the following, with reference to the drawing. Shown are FIG. 1 an electric circuit comprising a sensor module, a diagnostic mechanism allocated thereto, and a power supply, FIG. 2 a block diagram of the sensor module, FIG. 3 a graphic illustration of the output voltage at a control signal output of the diagnostic mechanism, wherein the time t is plotted on the abscissa and the output voltage U is plotted on the ordinate, FIG. 4 a graphic illustration of the voltage at an output terminal of the sensor module when an integrated switching circuit in the sensor module is defective, wherein the time t is plotted on the abscissa and the voltage U is plotted on the ordinate, and FIG. 5 an illustration similar to that of FIG. 4, wherein, however, the integrated switching circuit is operational.

DETAILED DESCRIPTION

Figure 1:
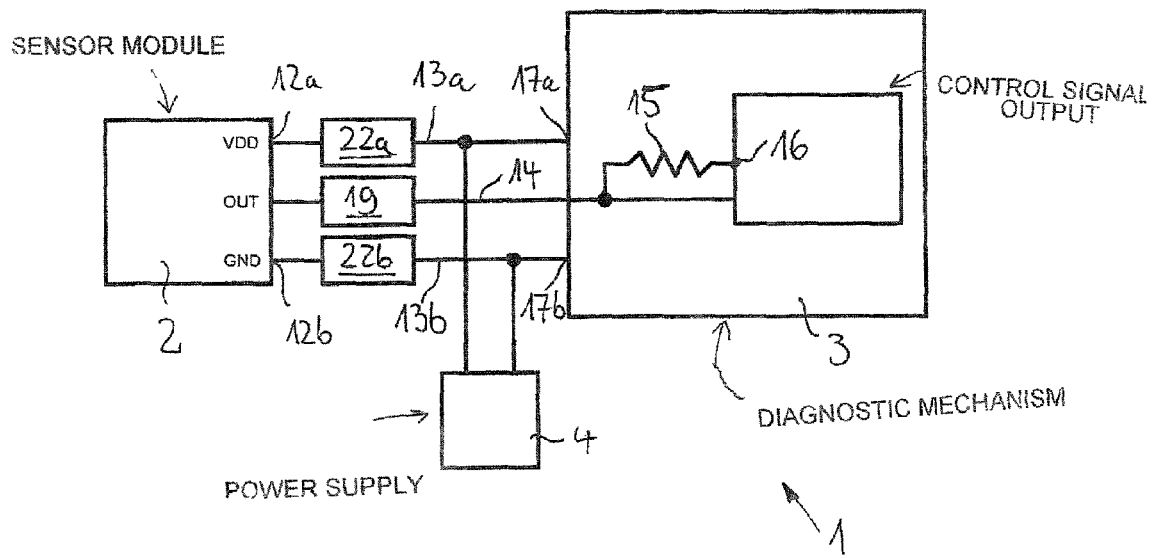

An electric circuit designated in its entirety by 1 in FIG. 1 has a sensor module 2, a diagnostic mechanism 3, and a power supply 4 for said elements. The sensor module 2 is configured as a monolithic module that contains an integrated switching circuit, which comprises a Hall sensor 5, an analog-digital convertor 6, a digital signal processor 7, a digital-analog convertor 8, and an analog amplifier stage 9. Additionally integrated in the sensor module 2 is a test device 10 for checking the operational capacity of these components internally.

Figure 2:
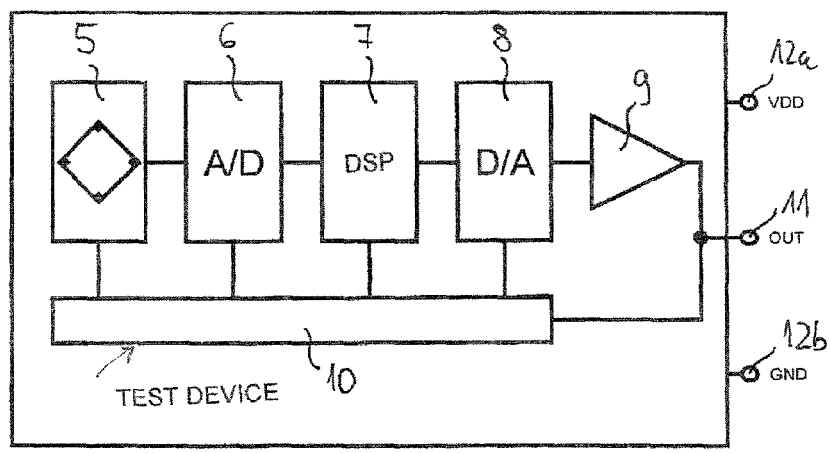

It can be discerned in FIG. 2 that a measurement signal output of the Hall sensor 5 for emitting a magnetic field measurement signal via the analog-digital convertor 6, the digital-analog convertor 8, and the amplifier stage 9 is connected to an output terminal 11 of the sensor module 2. The sensor module 2 further comprises two power supply terminals 12a, 12b, which are connected via cables 13a, 13b to operating voltage terminals of the power supply 4.

The output terminal 11 of the sensor module 2 is connected via a signal line 14 to the diagnostic mechanism 3. Furthermore, the signal line 14 is connected via a resistor to a control signal output 16 of the diagnostic mechanism 3. Voltage supply terminals 17a, 17b of the diagnostic mechanism 3 are connected to the operating voltage terminals of the power supply 4.

For checking the operation of the sensor module 2, the cables 13a, 13b, and the signal line 14, an operating voltage is first applied to the power supply terminals 12a, 12b of the sensor module 2 and the voltage supply terminals 17a, 17b of the diagnostic mechanism 3.

Figure 3:
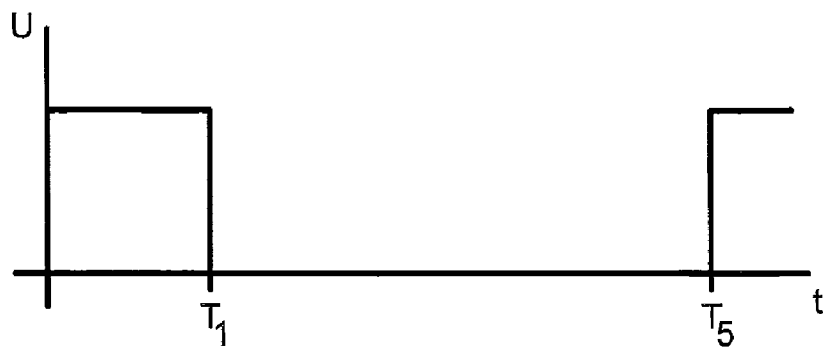
Figure 4:
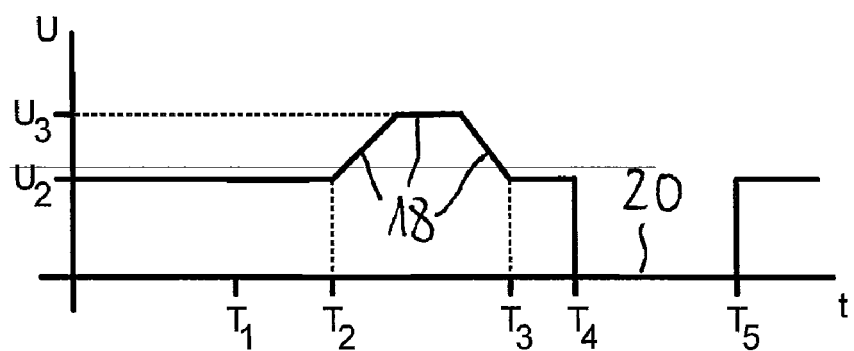

The sensor module 2 is then switched to a test mode in which the diagnostic mechanism 3 at the time $T_1$ emits a first control signal from the control signal output 16 (FIG. 3). The test device 10 connected via the output terminal 11 and the resistor 15 to the control signal output 16 detects the control signal and applies a test signal to an input of the analog-digital convertor 6, which test signal is selected in such a way that after a delay period, an approximately trapezoidal communication test signal 18 is emitted from the output terminal 11 of the sensor module 2 between the times $T_2$ and $T_3$ (FIG. 4, 5).

During the emission of the communication test signal 18, the analog-digital convertor 6 and the digital-analog convertor 8 run through at least part of their control range. At first the signal level of the communication test signal 18 rises more or less ramp-like, starting from a value $U_2$ until it reaches a value $U_3$. Afterwards the signal level remains constant at first, and then drops more or less ramp-like to the value $U_2$. In FIG. 4 it can be discerned that the potential of the communication test signal 18 lies above the output voltage $U_2$ residing at the output terminal 11 when the test mode is not activated.

The communication test signal 18 is read in by the diagnostic mechanism 3 and, for verifying the operation of communication with the sensor module 2, compared with a predefined tolerance band range, which is not shown in any greater detail in the drawing. In the event of coincidence with the tolerance band range, it is assumed that an error-free communication between the sensor module 2 and the diagnostic mechanism 3 via the signal line 14 is possible.

If the communication test signal 18 received by the diagnostic mechanism 3 does not coincide with the tolerance band range, it is assumed that there is interference in the communication with the sensor module 2 or that said communication is not possible. Such interference can be caused, for example, by a parasitic first resistor 19 in the signal line 14 (FIG. 1).

At this point the operation of the integrated switching circuit is tested in a manner known per se, using the test device 10. To this end, available signals in the sensor module are compared with target values or target value ranges and in the event of coincidence, it is assumed that the integrated switching circuit is operational. If at least one signal lies outside a permissible tolerance for this signal, it is assumed that the integrated switching circuit is defective.

In the last case mentioned, the sensor module 2 transmits an error signal 20 between the times $T_4$ and $T_5$ via the output terminal 11 to the diagnostic mechanism 3. As can be discerned in FIG. 4, the signal level of the error signal 20 corresponds to the ground potential. In FIG. 4 it can be further discerned that after the transmission of the communication test signal 18, a predetermined time period [$T_3 \ldots T_4$] is allowed to elapse first before the error signal 20 is applied to the output terminal 11.

Figure 5:
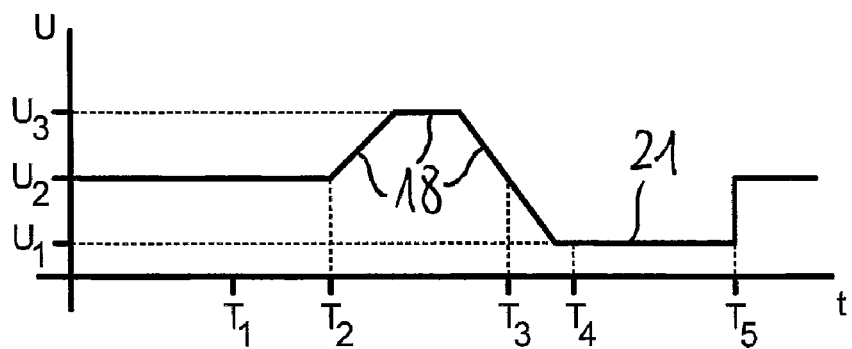

If the test of the integrated switching circuit shows that the latter is operational, the test device 10 starting from the time $T_4$ emits a function signal 21 from the output terminal 11 that is different from the error signal 20 (FIG. 5). The signal level of the function signal 21 is dependent on the voltage residing at the power supply terminals 12a, 12b of the sensor module 2. This is enabled by the ratiometric configuration of the amplifier stage 9.

In FIG. 5 it can be discerned that after the ending of the communication test signal 18, from the time $T_3$ on the ramp-shaped decline of the signal level at the output terminal is continued until the signal level reaches the value specified for the function signal. This value is then held constant in the time interval [$T_4 \ldots T_5$].

The signal received by the diagnostic mechanism 3 in the time interval [$T_4 \ldots T_5$] is compared with a tolerance range stored in the diagnostic mechanism 3 and also with a tolerance band assigned to the error signal 20. The tolerance range is selected so that it does not contain the tolerance band. If the signal received by the diagnostic mechanism 3 lies outside the tolerance range and outside the tolerance band, it is assumed that the error lies in the cables 13a, 13b. Such an error can be caused, for example, by a parasitic second resistor 22a, 22b in the cables 13a, 13b.

The diagnostic mechanism 3 then initiates suitable measures for limiting the effects of the error. For example, an emergency operation can be activated, in which a suitable substitute signal is generated and used in lieu of the measurement signal of the sensor module 2. When the error occurs, a first error message is displayed and/or filed in the data storage unit.

If the comparison shows that the signal received by the diagnostic mechanism 3 in the time interval [$T_4 \ldots T_5$] lies within the tolerance band allocated to the error signal 20, it is assumed that the integrated circuit is defective. In this case as well, the diagnostic mechanism 3 initiates suitable measures for limiting the effects of the error. When the error occurs, a second error message is displayed and/or filed in the data storage unit.

If the comparison shows that the signal received by the diagnostic mechanism 3 in the time interval [$T_4 \ldots T_5$] lies within the tolerance range, it is assumed that the integrated circuit and the cables 13a, 13b are free of errors. The diagnostic mechanism 3 then applies a second control signal to the signal line starting from the time $T_5$, which is received by the sensor module 2, whereupon the latter is switched from the test mode to an operating mode.

In the operating mode, the sensor module 2 in a manner known per se emits from the output terminal 11 the magnetic field measurement signal measured by the Hall sensor and processed by the signal processing stage comprising the analog-digital convertor 6, the digital signal processor 7, the digital-analog convertor 8, and the analog amplifier stage 9. The magnetic field measurement signal is transmitted via the signal line 14 to the diagnostic mechanism 3 and analyzed therein.

The invention claimed is:

1. A method for checking an operational capability of an electric circuit that has at least one sensor module and a diagnostic mechanism, the sensor module comprising an integrated switching circuit, at least one output terminal connected to the diagnostic mechanism and power supply terminals to which an operating voltage is applied via cables, the method comprising:
    switching said sensor module to a test mode, in which the sensor module emits a predefined communication test signal from the at least one output terminal, the test signal differing from a constant signal level;
    reading said test signal by the diagnostic mechanism;
    comparing the test signal with a predefined tolerance band range in order to verify that the communication with the sensor module is operational;
    testing the operation of the integrated switching current if said communication with the sensor module is verified as operational;
    transmitting an error signal from said sensor module via the output terminal to the diagnostic mechanism, if the switching circuit is not operational;
    transmitting a function signal from the sensor module via the output terminal to the diagnostic mechanism if the switching circuit is operational, wherein the functional signal is different from the error signal and the functional signal is dependent on a voltage residing at the power supply terminals; and
    comparing the function signal received by the diagnostic mechanism with a predefined tolerance range, wherein the presence or absence of an error in the cable is confirmed based on the result of this comparison.

2. The method as in claim 1, wherein the amplitude of the function signal is proportional to the voltage residing at the power supply terminals or to a component of this voltage.

3. The method as in claim 1, wherein the output terminal for emitting the error signal is set to a constant potential, particularly to ground potential.

4. The method as in claim 1, wherein the sensor module is switched between the test mode and an operating mode, and wherein at least one measurement signal is captured and emitted via the output terminal in the operating mode.

5. The method as in claim 1, wherein the switching between the test mode and the operating mode takes place as a function of an external voltage, which is applied to the output terminal, and/or as a function of an electric current, which is fed into the output terminal.

6. The method as in claim 1, wherein the sensor module is switched to the test mode by application of the operating voltage to the power supply terminals.

7. The method as in claim 1, wherein the communication test signal comprises at least one ramp-shaped, stair-shaped, trapezoidal and/or sawtooth signal section.

8. The method as in claim 1, wherein
    different communication test signals are allocated to at least two sensor modules;
    wherein a number of different tolerance band ranges is stored that corresponds to the number of different communication test signals, which in each case are allocated to a communication test signal;
    wherein at least one sensor module is switched to the test mode and transmits its allocated communication test signal to the diagnostic mechanism, and
    wherein the communication test signal received by the diagnostic mechanism is compared with the different tolerance band ranges, and the sensor module that emitted the communication test signal is identified based on the result of these comparisons.

9. The method as in claim 1, wherein the integrated switching circuit has at least one Hall plate with at least one measurement current input and at least one Hall voltage output, which is connected via a signal processing stage to the output terminal of the sensor module, and wherein for generating the communication test signal, a test signal is applied to the measurement current input and/or to the Hall voltage output of the Hall plate and conducted via the signal processing stage to the output terminal.

* * * * *